(12) United States Patent
Xie et al.

(10) Patent No.: US 11,087,993 B2
(45) Date of Patent: Aug. 10, 2021

(54) DOUBLE REPLACEMENT METAL LINE PATTERNING

(71) Applicant: INTERNATIONAL BUSINESS MACHINES CORPORATION, Armonk, NY (US)

(72) Inventors: Ruilong Xie, Niskayuna, NY (US); Chih-Chao Yang, Glenmont, NY (US); Kangguo Cheng, Schenectady, NY (US); Hsueh-Chung Chen, Cohoes, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/531,811

(22) Filed: Aug. 5, 2019

(65) Prior Publication Data

US 2021/0043462 A1 Feb. 11, 2021

(51) Int. Cl.
*H01L 21/311* (2006.01)
*H01L 21/768* (2006.01)

(52) U.S. Cl.
CPC .... *H01L 21/31144* (2013.01); *H01L 21/7682* (2013.01); *H01L 21/76816* (2013.01); *H01L 21/76829* (2013.01); *H01L 21/76877* (2013.01); *H01L 21/76897* (2013.01)

(58) Field of Classification Search
CPC .......................... H01L 21/76807–76813; H01L 2221/1015–1036; H01L 2221/1063
See application file for complete search history.

(56) References Cited

U.S. PATENT DOCUMENTS

| | | | |
|---|---|---|---|
| 6,465,358 B1 * | 10/2002 | Nashner | H01L 21/02063 257/E21.252 |
| 9,679,805 B2 | 6/2017 | Bouche et al. | |
| 9,735,029 B1 | 8/2017 | Chu et al. | |
| 9,748,138 B2 | 8/2017 | Yeh | |
| 9,793,164 B2 | 10/2017 | Machkaoutsan et al. | |
| 10,079,173 B2 | 9/2018 | Xie et al. | |
| 10,109,486 B2 | 10/2018 | Huang et al. | |
| 10,177,240 B2 | 1/2019 | Greene et al. | |
| 10,192,780 B1 | 1/2019 | Wang et al. | |
| 2014/0308794 A1 * | 10/2014 | Lee | H01L 27/10855 438/381 |
| 2016/0056104 A1 | 2/2016 | Bouche et al. | |
| 2016/0155664 A1 * | 6/2016 | Chan | H01L 21/3212 438/643 |
| 2017/0140986 A1 | 5/2017 | Machkaoutsan et al. | |
| 2018/0096932 A1 | 4/2018 | Xie et al. | |
| 2018/0269306 A1 | 9/2018 | Bao et al. | |

FOREIGN PATENT DOCUMENTS

WO 2017204821 11/2017

\* cited by examiner

*Primary Examiner* — Julio J Maldonado
*Assistant Examiner* — Mohammed A Rahman
(74) *Attorney, Agent, or Firm* — Tutunjian & Bitetto, P.C.; L. Jeffrey Kelly

(57) ABSTRACT

Integrated chips and methods of forming the same include forming lines of alternating first and second sacrificial fills in a film. A dielectric cut is formed in at least one of the first sacrificial fills. A dielectric cut is formed in at least one of the second sacrificial fills. Remaining first and second sacrificial fill material is replaced with a conductive material. The film is replaced with a final dielectric material.

14 Claims, 9 Drawing Sheets

DOUBLE REPLACEMENT METAL LINE PATTERNING

BACKGROUND

The present invention generally relates to integrated chip fabrication and, more particularly, to back end of line patterning that improves metal cut margins and provides superior low-k dielectric integrity.

Back end of line (BEOL) processing for an integrated chip can include the fabrication of metal lines that provide interconnects for individual devices on the chip. Cutting these metal lines to appropriate lengths includes a patterning process that can, in some cases, be misaligned to the positioning of the lines. Such mispositioning errors can result in a cut damaging a neighboring metal line, decreasing device yield.

Additionally, if low-k dielectric materials are used for an interlayer dielectric, such materials can be damaged by etching processes involved in the metal line patterning and formation processes. The erosion of the low-k dielectric materials in such cases creates unpredictability in the size and shape of the metal lines and, furthermore, decreases the reliability of the dielectric.

SUMMARY

A method of forming an integrated chip includes forming lines of alternating first and second sacrificial fills in a film. A dielectric cut is formed in at least one of the first sacrificial fills. A dielectric cut is formed in at least one of the second sacrificial fills. Remaining first and second sacrificial fill material is replaced with a conductive material. The film is replaced with a final dielectric material.

A method of forming an integrated chip includes forming lines of alternating first and second sacrificial fills in a film, separated from one another by portions of the film, from distinct, selectively etchable materials. A first cut is formed in at least one of the first sacrificial fills. A second cut is formed in at least one of the second sacrificial fills. Respective dielectric plugs are formed in each of the first and second cuts. Remaining first and second sacrificial fill material is replaced with a conductive material. The film is replaced with a low-k dielectric material that has air gaps.

An integrated chip includes parallel conductive lines. A first dielectric material is formed between adjacent parallel conductive lines. One or more dielectric plugs are formed between respective pairs of collinear conductive lines in the parallel conductive lines, formed from a second dielectric material that is distinct from the first dielectric material.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention perform back end of line (BEOL) metal line fabrication in a manner that prevents damage due to patterning misalignment and can also make use of low-k dielectric materials without risk of damage to those materials. Toward this end, the present embodiments make use of two, selectively etchable sacrificial materials as placeholders for the formation of the metal lines. Cuts can be performed on the sacrificial materials without risk of damaging neighboring lines—during a cut process for a first sacrificial material, any misalignment error would expose a second sacrificial material that would not be damaged by the etching process for the first sacrificial material. Once the cuts are performed and a third selectively etchable material is deposited in the cut regions, the first and second sacrificial materials can be removed and replaced by a conductive material. An interlayer dielectric can then be formed using any appropriate material, including low-k materials that would otherwise have been damaged by the previous etching steps.

Figure 1:
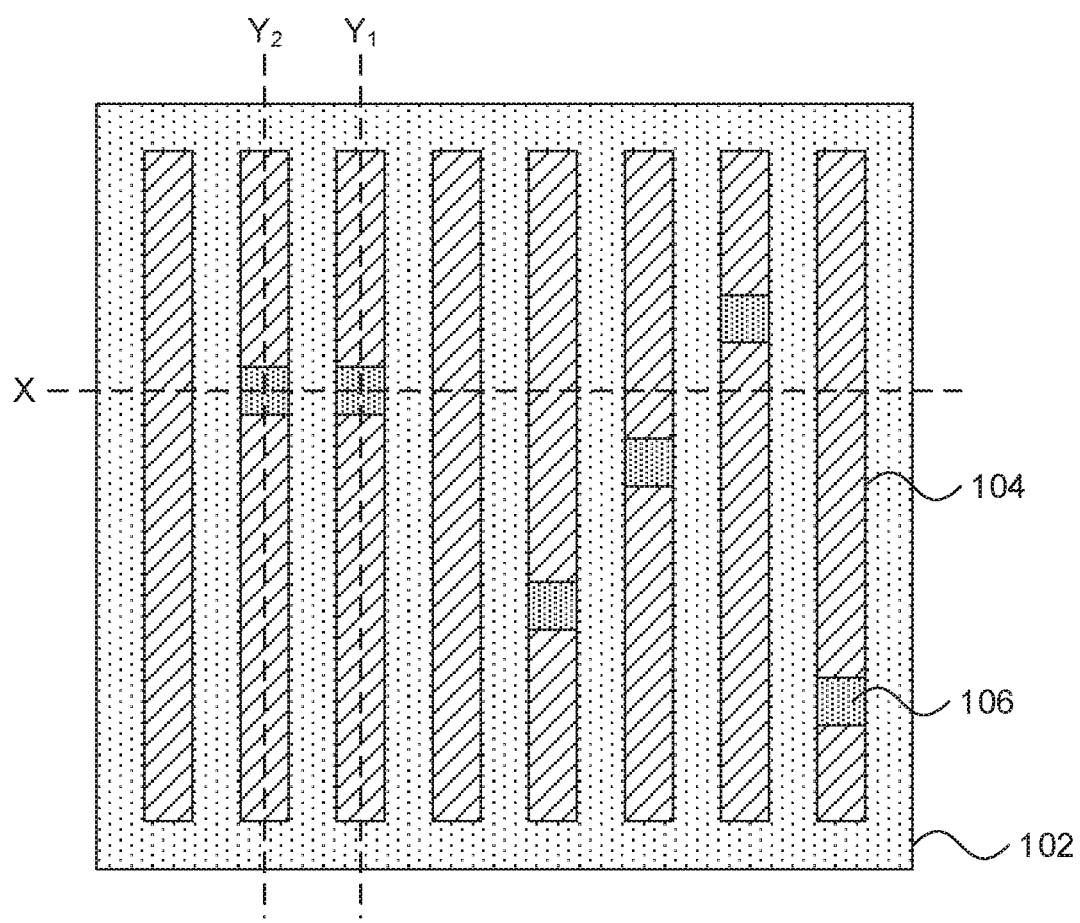
FIG. 1 is a top-down view of a set of parallel conductive lines in a layer that have been cut to separate particular conductive lines into distinct electrical regions in accordance with an embodiment of the present invention.

Referring now to the drawings in which like numerals represent the same or similar elements and initially to FIG. 1, a top-down view of a finished BEOL layer is shown. A set of metal lines 104 are shown, surrounded by an interlayer dielectric 102. One or more of the metal lines 104 are cut along their lengths into two or more sections by cut dielectric regions 106. The top-down view illustrates a set of different cross-sectional planes, X, $Y_1$, and $Y_2$. The X cross-section cuts across multiple metal lines 104, while $Y_1$ and $Y_2$ cut parallel to the length of respective metal lines 104—it is specifically contemplated that $Y_1$ and $Y_2$ cut parallel to neighboring lines as shown.

It is specifically contemplated that the interlayer dielectric 102 can be formed from a low-k dielectric material. A low-k dielectric material is a material that has a dielectric constant k that is lower than the dielectric constant of silicon dioxide.

Figure 2:
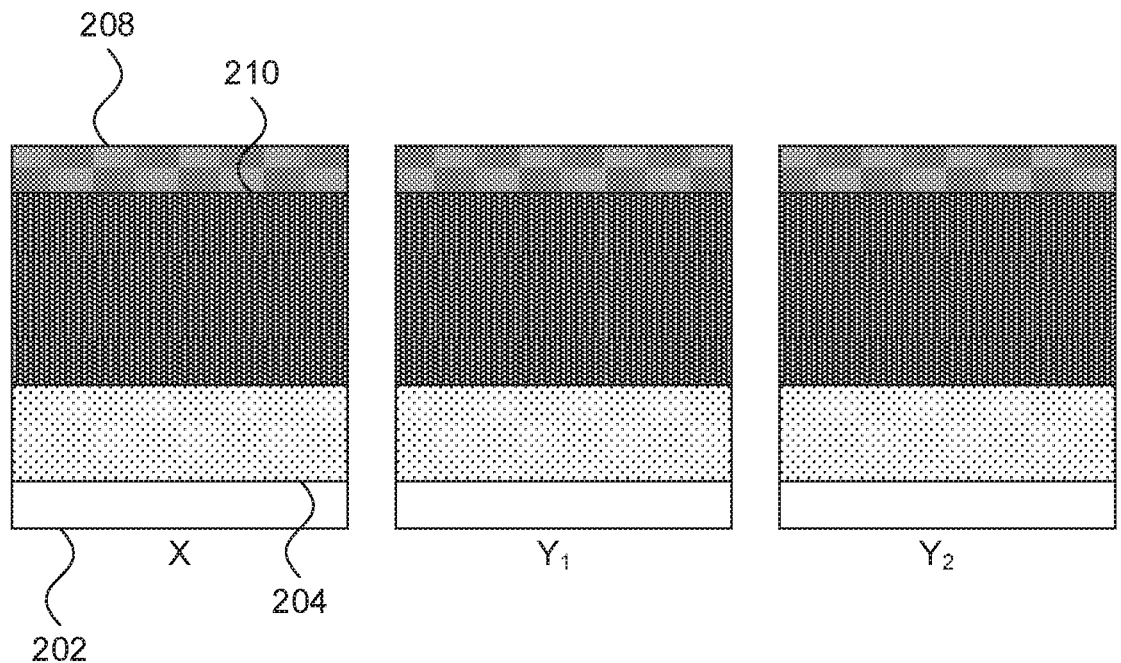
FIG. 2 is a set of cross-sectional views of a step in the formation of an integrated chip with a set of parallel conductive lines in a layer that are cut to separate particular conductive lines into distinct electrical regions that shows a sacrificial film formed on a via layer in accordance with an embodiment of the present invention.

Referring now to FIG. 2, a set of cross-sectional views of a step in the fabrication of metal lines in a BEOL process is shown. At this stage, each cross section shows the same set of layers. A via dielectric layer 204 is formed on an underlying device layer 202. A sacrificial film 206 is formed on the via dielectric layer 204 and a hardmask layer 208 is formed on the sacrificial film 206. The sacrificial film 206 will be patterned to establish locations for the formation of metal lines. It is specifically contemplated that the sacrificial film 206 can be formed from, e.g., amorphous silicon by any appropriate deposition process including, e.g., chemical vapor deposition (CVD), physical vapor deposition (PVD), atomic layer deposition (ALD), or gas cluster ion beam (GCIB) deposition. The hardmask layer 208 can be formed from any appropriate hardmask material such as, e.g., titanium nitride or silicon nitride and can be formed by any appropriate deposition process.

As to the via dielectric layer 204, it is specifically contemplated that the dielectric material of the via dielectric layer 204 will be selectively etchable relative to the material of the sacrificial film 206 and the material(s) of the underlying device layer 202. As used herein, the term "selective" in reference to a material removal process denotes that the rate of material removal for a first material is greater than the rate of removal for at least another material of the structure to which the material removal process is being applied.

The gate dielectric layer 502 may be formed by any appropriate process including, e.g., chemical vapor deposition (CVD), physical vapor deposition (PVD), atomic layer deposition (ALD), or gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Figure 3:
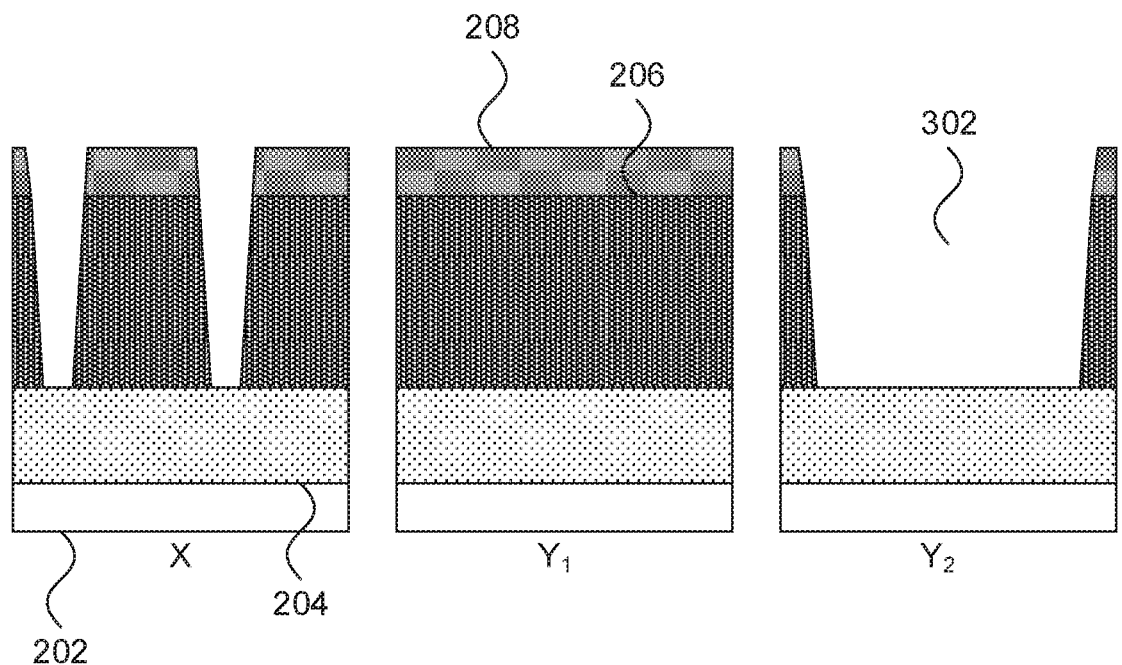
FIG. 3 is a set of cross-sectional views of a step in the formation of an integrated chip with a set of parallel conductive lines in a layer that are cut to separate particular conductive lines into distinct electrical regions that shows a first set of trenches formed in the sacrificial film in accordance with an embodiment of the present invention.

Referring now to FIG. 3, a set of cross-sectional views of a step in the fabrication of metal lines in a BEOL process is shown. A first set of lines are patterned into the hardmask layer 208 using any appropriate process, such as a photolithographic process. The patterned hardmask layer 208 is then used as a mask to etch down into the sacrificial film 206 using an anisotropic etch process such as, e.g., a reactive ion etch (RIE). The anisotropic etch forms etched lines 302. It is specifically contemplated that the anisotropic etch is selective to the sacrificial film 206, removing material from the sacrificial film 208 without substantially damaging the hardmask layer 208 and the via dielectric layer 204.

RIE is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching, or laser ablation.

Figure 4:
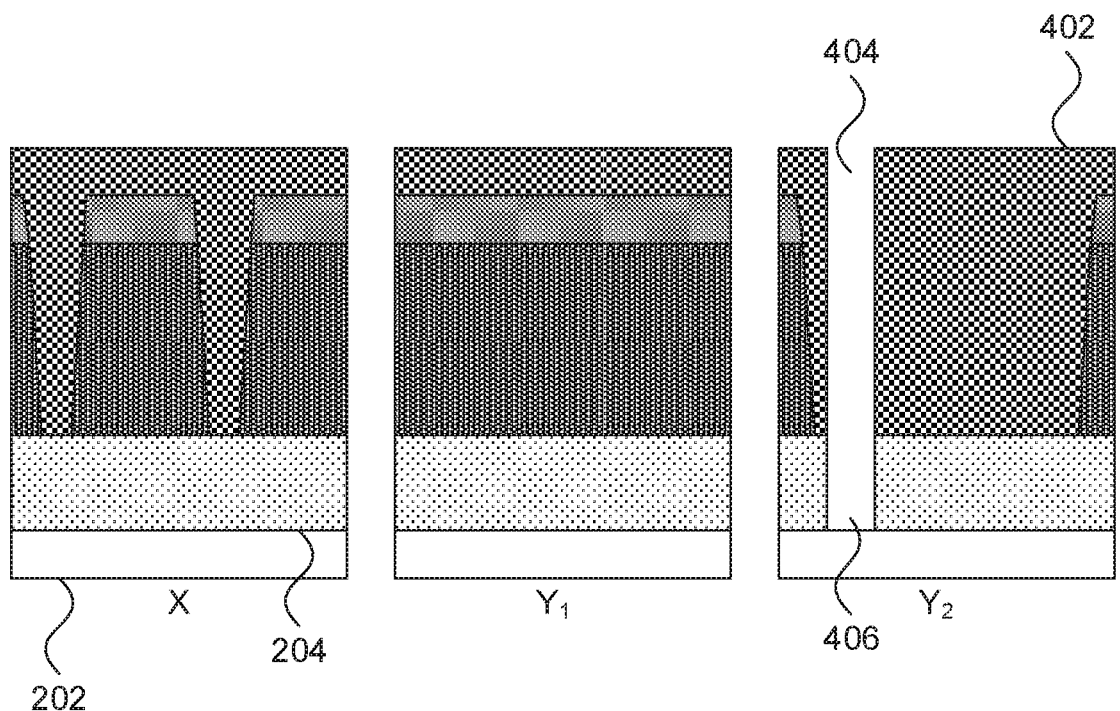
FIG. 4 is a set of cross-sectional views of a step in the formation of an integrated chip with a set of parallel conductive lines in a layer that are cut to separate particular conductive lines into distinct electrical regions that shows a via formed in the first set of trenches in accordance with an embodiment of the present invention.

Referring now to FIG. 4, a set of cross-sectional views of a step in the fabrication of metal lines in a BEOL process is shown. An organic planarizing layer (OPL) 402 is formed over the hardmask layer 208 and fills the etched lines 302. Vias 404 are etched down into the OPL 402 to establish locations for vias in the via dielectric layer 204. The via dielectric layer 402 is then etched down to the underling device layer 202 using a selective anisotropic etch to form vias 406.

The OPL 402 can include a photo-sensitive organic polymer that, when exposed to electromagnetic (EM) radiation, changes chemically to be removable by a developing solvent. Examples of photo-sensitive organic polymers may include polyacrylate resin, epoxy resin, phenol resin, polyamide resin, polyimide resin, unsaturated polyester resin, polyphenylenether resin, polyphenylenesulfide resin, or benzocyclobutene. More generally, the developable OPL 402 may be formed from any organic polymer and a photo-active compound having a molecular structure that can attach to the molecular structure of the organic polymer. The developable OPL 402 may, for example, be applied using spin coating technology or a flowable CVD process.

Figure 5:
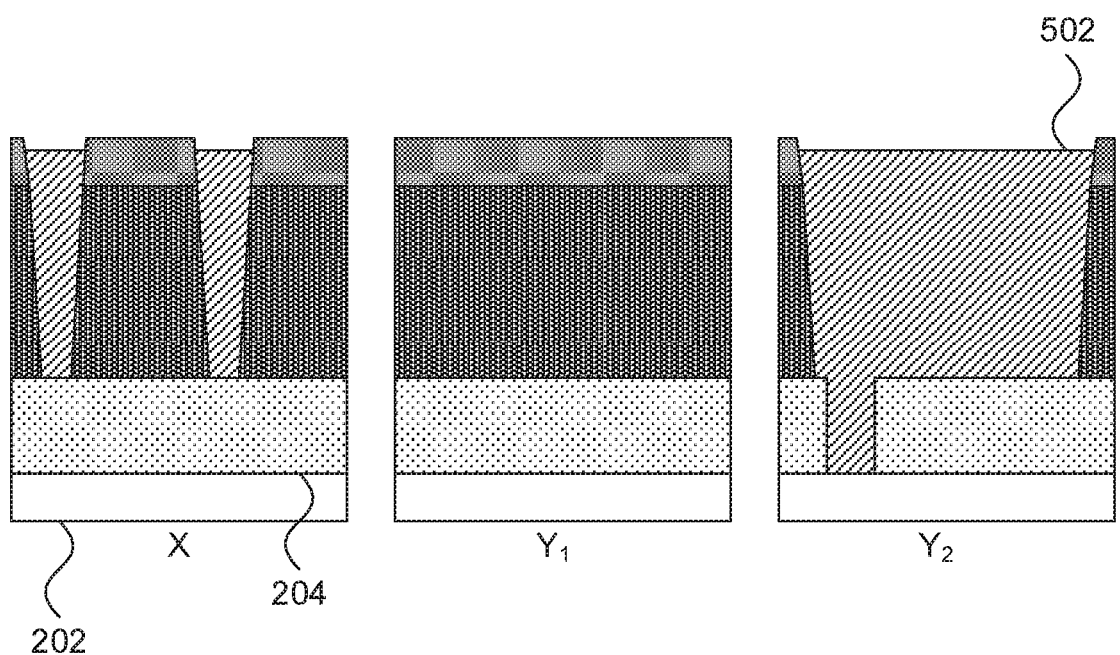
FIG. 5 is a set of cross-sectional views of a step in the formation of an integrated chip with a set of parallel conductive lines in a layer that are cut to separate particular conductive lines into distinct electrical regions that shows a first sacrificial fill in the first trenches in accordance with an embodiment of the present invention.

Referring now to FIG. 5, a set of cross-sectional views of a step in the fabrication of metal lines in a BEOL process is shown. The OPL layer 402 is etched away with any appropriately selective isotropic or anisotropic etch. A first sacrificial fill 502 is deposited using any appropriate deposition process. The first sacrificial fill 502 is formed from a material that is selectively etchable with respect to the sacrificial film 206 and the via dielectric layer 204. In some embodiments, the first sacrificial fill 502 can be formed from silicon dioxide, by ALD. After formation, the first sacrificial fill 502 can etched back to below a height of the hardmask 208 or can be polished down to the level of the hardmask 208 using a chemical mechanical planarization (CMP) process.

CMP is performed using, e.g., a chemical or granular slurry and mechanical force to gradually remove upper layers of the device. The slurry may be formulated to be unable to dissolve, for example, the hardmask 208, resulting in the CMP process's inability to proceed any farther than that layer.

Figure 6:
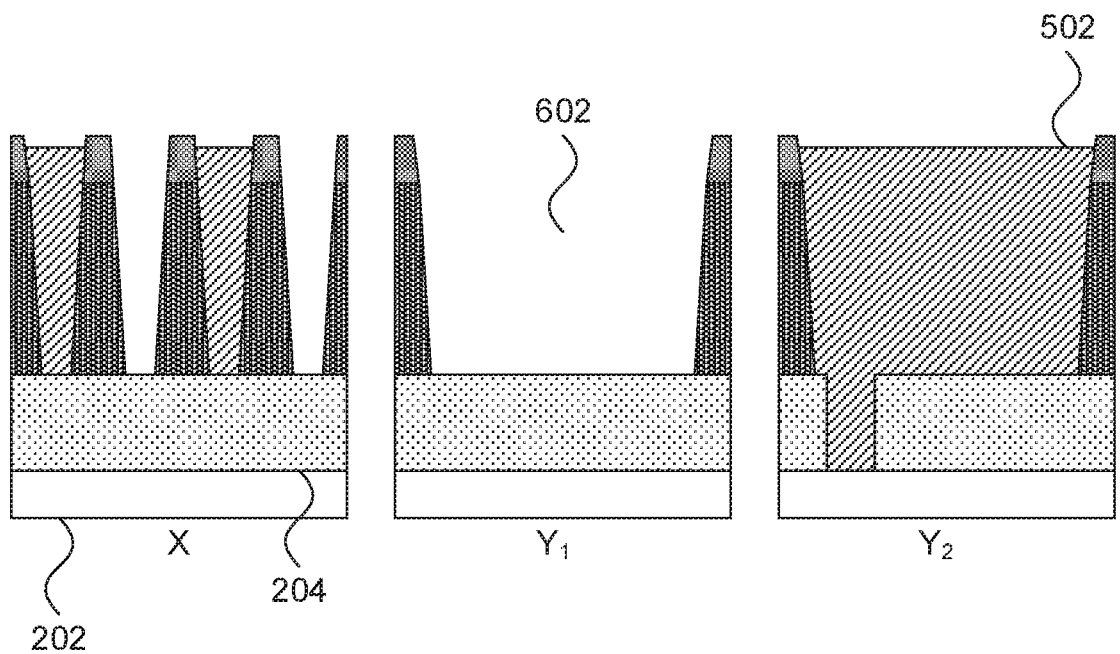
FIG. 6 is a set of cross-sectional views of a step in the formation of an integrated chip with a set of parallel conductive lines in a layer that are cut to separate particular conductive lines into distinct electrical regions that shows a second set of trenches being formed in the sacrificial film in accordance with an embodiment of the present invention.

Referring now to FIG. 6, a set of cross-sectional views of a step in the fabrication of metal lines in a BEOL process is shown. A second set of lines are patterned into the hardmask layer 208 using any appropriate process, such as a photolithographic process. The patterned hardmask layer 208 is then used as a mask to etch down into the sacrificial film 206 using an anisotropic etch process such as, e.g., a reactive ion etch (RIE). The anisotropic etch forms etched lines 602. It is specifically contemplated that the anisotropic etch is selective to the sacrificial film 206 and the first sacrificial fill 502, removing material from the sacrificial film 208 without substantially damaging the hardmask layer 208, the via dielectric layer 204, and the first sacrificial fill 502.

Figure 7:
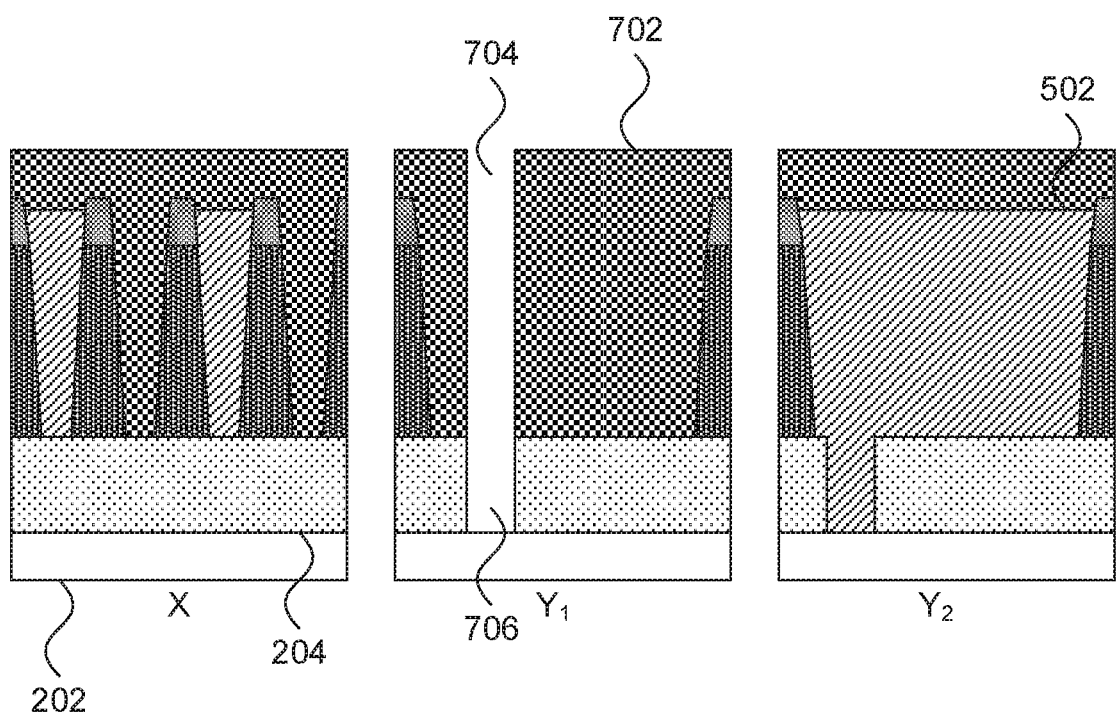
FIG. 7 is a set of cross-sectional views of a step in the formation of an integrated chip with a set of parallel conductive lines in a layer that are cut to separate particular conductive lines into distinct electrical regions that shows a via being formed in the second set of trenches in accordance with an embodiment of the present invention.

Referring now to FIG. 7, a set of cross-sectional views of a step in the fabrication of metal lines in a BEOL process is shown. An OPL 702 is formed over the hardmask layer 208 and fills the etched lines 602. Vias 704 are etched down into the OPL 702 to establish locations for vias in the via dielectric layer 204. The via dielectric layer 702 is then etched down to the underling device layer 202 using a selective anisotropic etch to form vias 706.

Figure 8:
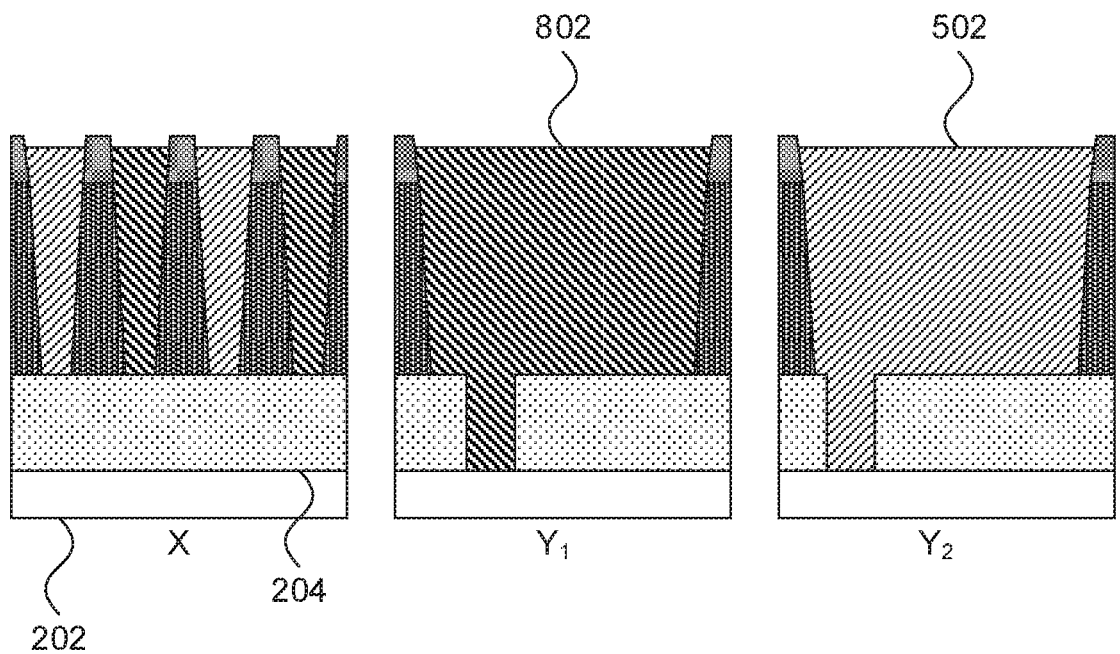
FIG. 8 is a set of cross-sectional views of a step in the formation of an integrated chip with a set of parallel conductive lines in a layer that are cut to separate particular conductive lines into distinct electrical regions that shows a second sacrificial fill in the second trenches in accordance with an embodiment of the present invention.

Referring now to FIG. 8, a set of cross-sectional views of a step in the fabrication of metal lines in a BEOL process is shown. The OPL layer 702 is etched away with any appropriately selective isotropic or anisotropic etch. A second sacrificial fill 802 is deposited using any appropriate deposition process. The second sacrificial fill 802 is formed from a material that is selectively etchable with respect to the sacrificial film 206, the via dielectric layer 204, and the first sacrificial fill 502. In some embodiments, the second sacrificial fill 802 can be formed from silicon carbide. After formation, the second sacrificial fill 802 can etched back to below a height of the hardmask 208 or can be polished down to the level of the hardmask 208 using a chemical mechanical planarization (CMP) process.

Figure 9:
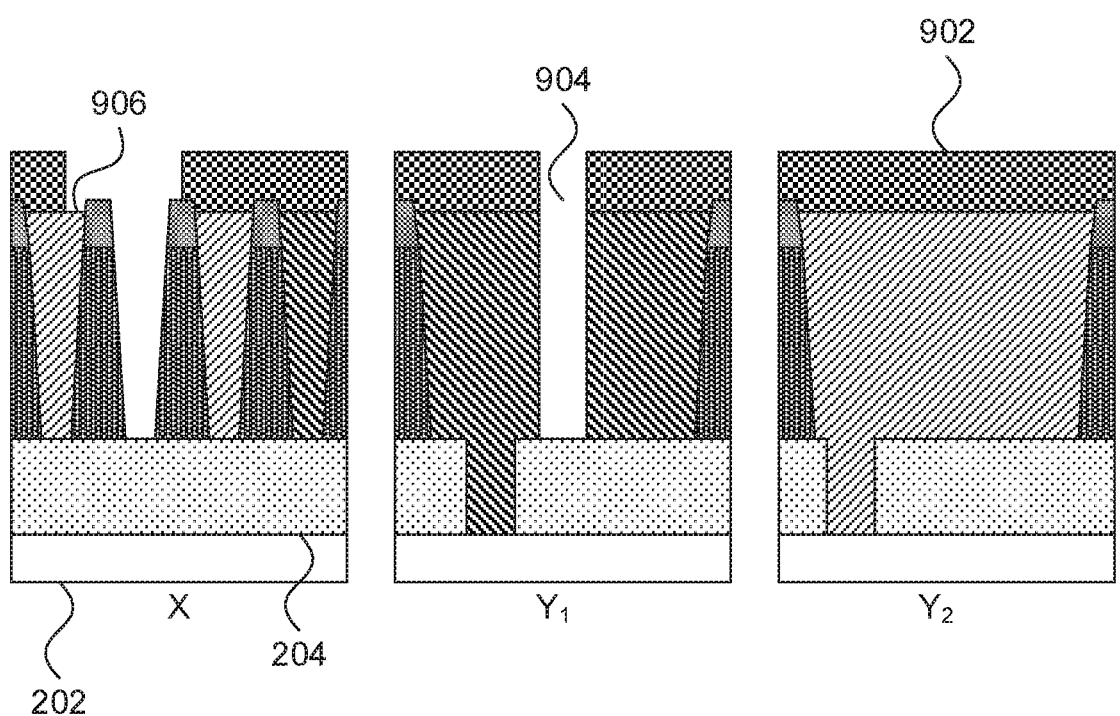
FIG. 9 is a set of cross-sectional views of a step in the formation of an integrated chip with a set of parallel conductive lines in a layer that are cut to separate particular conductive lines into distinct electrical regions that shows the formation of a cut in the first sacrificial fill in accordance with an embodiment of the present invention.

Referring now to FIG. 9, a set of cross-sectional views of a step in the fabrication of metal lines in a BEOL process is shown. An first cut OPL 902 is formed over the first sacrificial fill 502 and the second sacrificial fill 802. An opening 904 is formed in the first cut OPL 902 and the first cut OPL 902 is used as a mask to etch down into the second sacrificial fill 802. It should be understood that the opening 904 could alternatively been formed over the first sacrificial fill 502 at this stage. In some embodiments, the opening 904 can expose a portion 906 of the first sacrificial fill 502 of a neighboring line, for example due to a positioning error in forming the first cut OPL mask 902.

A selective anisotropic etch is used to remove exposed material from the second sacrificial fill 802, down to the bottom of the layer, to expose a portion of the underlying via dielectric layer 204. Because the etch is selective to the second sacrificial fill 802, the exposed portion 906 of the first sacrificial fill 502 is not damaged by the etch.

Figure 10:
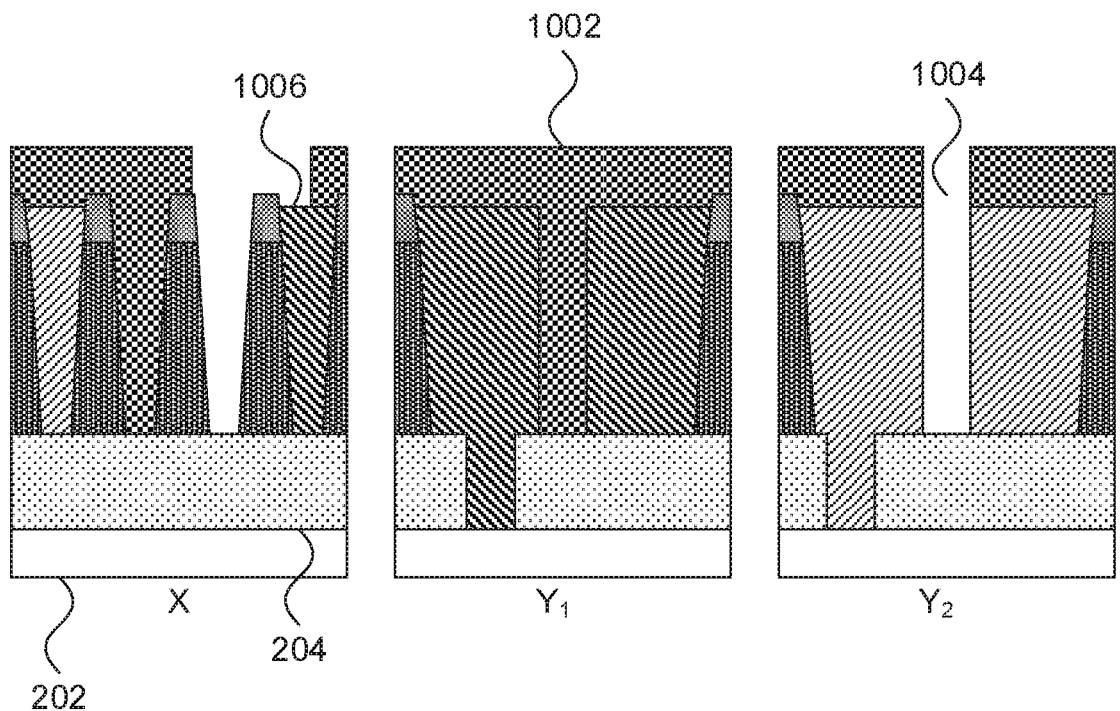
FIG. 10 is a set of cross-sectional views of a step in the formation of an integrated chip with a set of parallel conductive lines in a layer that are cut to separate particular conductive lines into distinct electrical regions that shows the formation of a cut in the second sacrificial fill in accordance with an embodiment of the present invention.

Referring now to FIG. 10, a set of cross-sectional views of a step in the fabrication of metal lines in a BEOL process is shown. The first cut OPL 902 is removed. A second cut OPL 1002 is formed over the first sacrificial fill 502 and the second sacrificial fill 802. An opening 1004 is formed in the second cut OPL 1002 and the second cut OPL 1002 is used as a mask to etch down into the first sacrificial fill 502. It should be understood that the opening 1004 could alternatively been formed over the second sacrificial fill 802 at this stage. In some embodiments, the opening 1004 can expose a portion 1006 of the second sacrificial fill 802 of a neighboring line, for example due to a positioning error in forming the second cut OPL mask 1002.

A selective anisotropic etch is used to remove exposed material from the first sacrificial fill 502, down to the bottom of the layer, to expose a portion of the underlying via dielectric layer 204. Because the etch is selective to the first sacrificial fill 502, the exposed portion 1006 of the second sacrificial fill 802 is not damaged by the etch.

Figure 11:
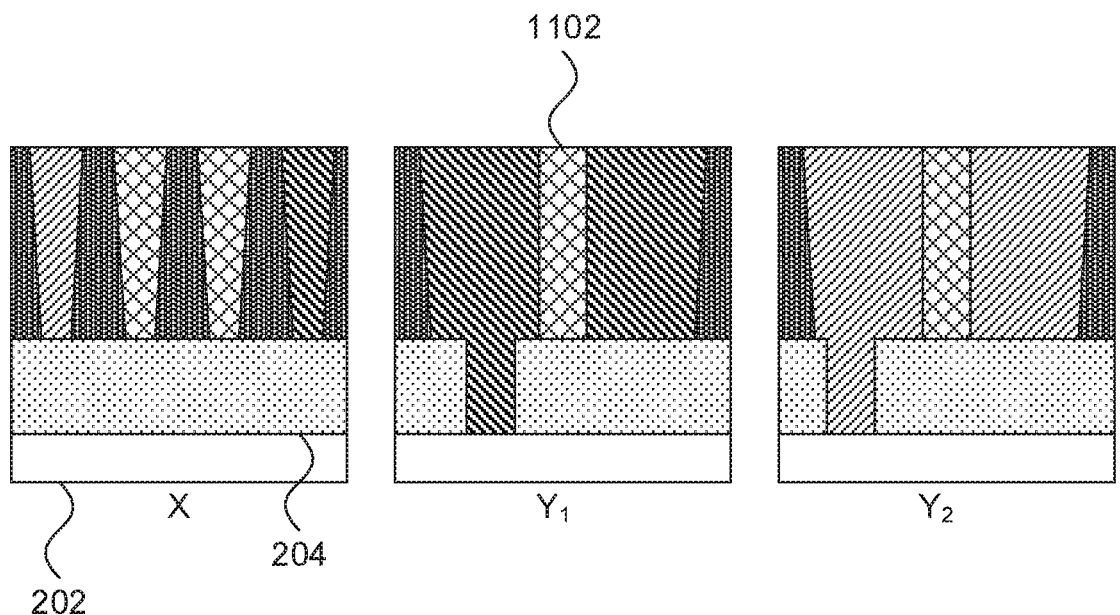
FIG. 11 is a set of cross-sectional views of a step in the formation of an integrated chip with a set of parallel conductive lines in a layer that are cut to separate particular conductive lines into distinct electrical regions that shows the formation of dielectric plugs in the cuts in accordance with an embodiment of the present invention.

Referring now to FIG. 11, a set of cross-sectional views of a step in the fabrication of metal lines in a BEOL process is shown. The second cut OPL 1002 is removed. A dielectric material is deposited to fill the openings in the first fill dielectric 502 and the second fill dielectric 802. The dielectric material should be selectively etchable relative to the first fill dielectric 502, the second fill dielectric 802, the sacrificial film 206, and the via dielectric layer 204. In some embodiments, it is specifically contemplated that the dielectric material can be formed from aluminum oxide. After deposition, CMP can be used to polish down to the level of the sacrificial film 206, removing any portions of the hardmask 208, the first dielectric fill 502, and the second dielectric fill 802 above the sacrificial film 206 and separating out dielectric plugs 1102.

Figure 12:
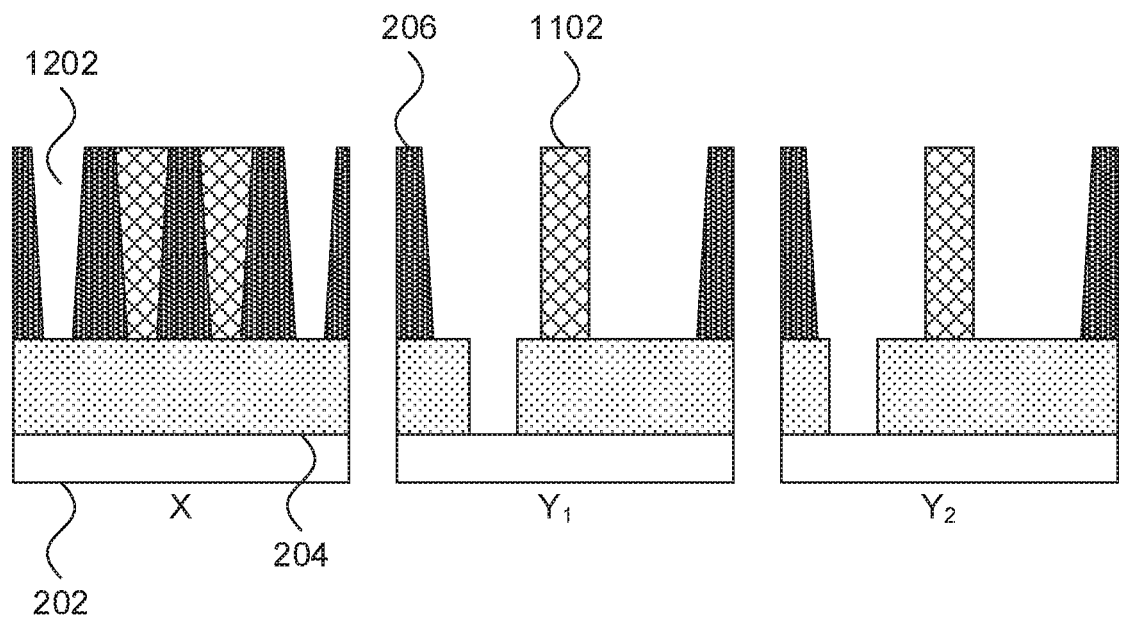
FIG. 12 is a set of cross-sectional views of a step in the formation of an integrated chip with a set of parallel conductive lines in a layer that are cut to separate particular conductive lines into distinct electrical regions that shows the removal of the first and second sacrificial fills in accordance with an embodiment of the present invention.

Referring now to FIG. 12, a set of cross-sectional views of a step in the fabrication of metal lines in a BEOL process is shown. The first dielectric fill 502 and the second dielectric fill 802 are etched away to expose lines 1202. The removal of the dielectric fills can be performed using a single etch that is selective to the fill materials and does not harm the dielectric plugs 1102, the sacrificial film 206, the dielectric via layer 204, or the underlying device layer 202. Alternatively, each of the dielectric fills can be separately etched away. An OPL (not shown) can be deposited to protect the lines exposed by removal of one fill during removal of the other.

Figure 13:
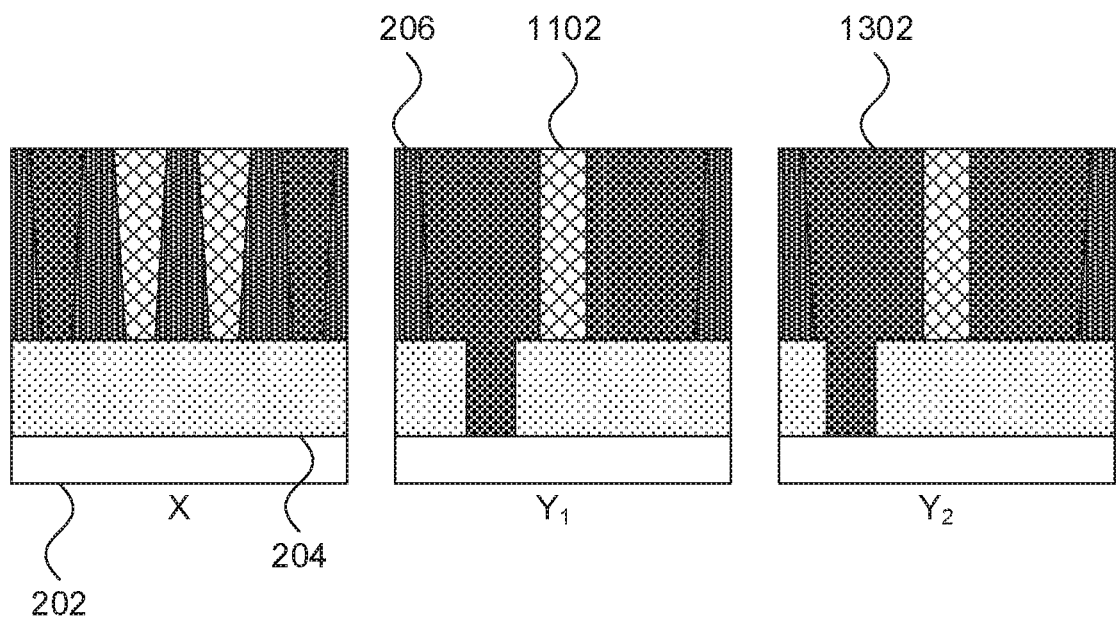
FIG. 13 is a set of cross-sectional views of a step in the formation of an integrated chip with a set of parallel conductive lines in a layer that are cut to separate particular conductive lines into distinct electrical regions that shows the formation of conductive lines in the first and second trenches in accordance with an embodiment of the present invention.

Referring now to FIG. 13, a set of cross-sectional views of a step in the fabrication of metal lines in a BEOL process is shown. A conductive material is deposited and polished down to the level of the sacrificial film 206. The conductive material forms conductive lines 1302, which are cut in places by the dielectric plugs 1102. Appropriate conductive materials for the conductive lines 1302 include, e.g., tungsten, nickel, titanium, molybdenum, tantalum, copper, platinum, silver, gold, ruthenium, iridium, rhenium, rhodium, and alloys thereof. The conductive lines 1302 will have a positive taper along the direction parallel to the length of the lines. In other words, the width of the conductive lines 1302 will be greatest at a top surface and will taper to a smaller width at the dielectric via layer 204.

Figure 14:
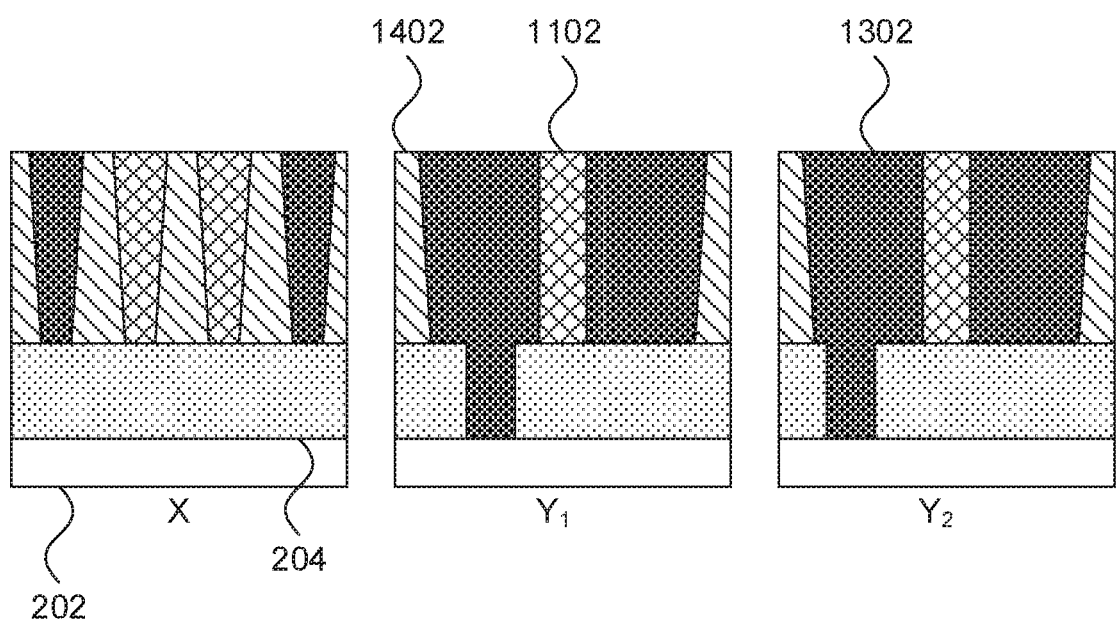
FIG. 14 is a set of cross-sectional views of a step in the formation of an integrated chip with a set of parallel conductive lines in a layer that are cut to separate particular conductive lines into distinct electrical regions that shows the replacement of the sacrificial film with an interlayer dielectric in accordance with an embodiment of the present invention.

Referring now to FIG. 14, a set of cross-sectional views of a step in the fabrication of metal lines in a BEOL process is shown. The remaining portions of the sacrificial film 206 are etched away with a selective etch that does not substantially harm the conductive lines 1302 or the via dielectric layer 204. The gaps are filled with a dielectric material 1402. It should be understood that any appropriate dielectric material can be used. In some embodiments, the dielectric material can be a low-k dielectric, such as hydrogenated silicon oxycarbide (SiCOH). In other embodiments, the dielectric material can include air gaps to further lower the dielectric constant of the material. Because the dielectric 1402 is formed after the metal lines 1302, there is no damage to the resulting dielectric structures that could have occurred due to the removal of the fill materials. It is specifically contemplated that the dielectric material 1402 can be formed from a dielectric material that is distinct from the dielectric plugs 1102.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or features) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood at yen a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 15:
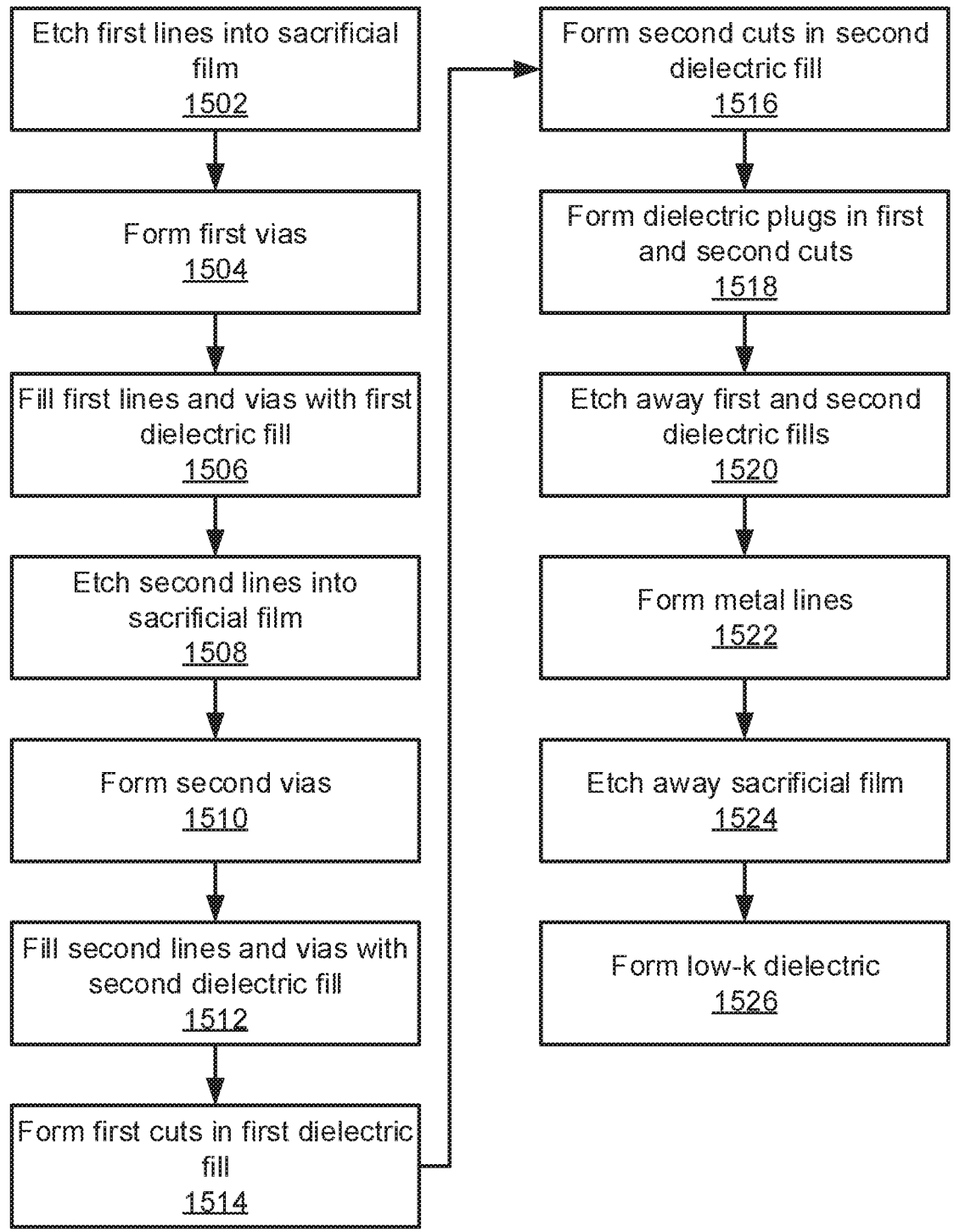
FIG. 15 is a block/flow diagram of a process for forming an integrated chip with a set of parallel conductive lines in a layer that are cut to separate particular conductive lines into distinct electrical regions.

Referring now to FIG. 15, a method of forming an integrated chip is shown. Block 1502 etches first lines 302 into a sacrificial film 206 using any appropriate process, such as photolithography and an anisotropic etch. Block 1504 forms first vias 406 in a dielectric via layer 204 to connect the first lines 302 to the underlying device layer 202. Block 1506 fills the first lines 302 and first vias 406 with a first dielectric fill 502.

Block 1508 etches second lines 602 into the sacrificial film 206 using any appropriate process, such as photolithography and an anisotropic etch. Block 1510 forms second vias 706 in the dielectric via layer 204 to connect the second lines 602 to the underlying device layer 202. Block 1512 fills the second lines 602 and second vias 706 with a second dielectric fill 802.

Block 1514 forms cuts in the first dielectric fill 502 by patterning an OPL 902 and using a selective anisotropic etch to etch down into the first dielectric fill 502 without substantially harming any exposed portions of the second dielectric fill 802. Block 1516 then forms cuts in the second dielectric fill 802 in a similar manner, using a selective anisotropic etch to etch down into the second dielectric fill 802 without substantially harming any exposed portions of the first dielectric fill 502.

Block 1518 forms dielectric plugs 1102 in the cuts from a material that can be selectively etched. Block 1520 etches away the first dielectric fill 502 and the second dielectric fill 802 using one or more etches that selectively remove these materials, without substantially harming the dielectric plugs 1102. Block 1522 forms metal lines 1302 in the first lines 302 and the second lines 602, around the dielectric plugs 1102. Block 1524 etches away the remaining portions of the sacrificial film 206 and block 1526 forms a final dielectric material 1402, such as a low-k dielectric with air gaps.

Having described preferred embodiments of double replacement metal line patterning (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming an integrated chip, comprising:
   forming lines of alternating first and second sacrificial fills in a film, wherein the first and second dielectric fills are formed from distinct, selectively etchable materials;
   forming a dielectric cut in at least one of the first sacrificial fills;
   forming a dielectric cut in at least one of the second sacrificial fills;
   replacing remaining first and second sacrificial fill material with a conductive material; and
   replacing the film with a final dielectric material.

2. The method of claim 1, wherein forming the dielectric cut in at least one of the first sacrificial fills comprises forming a first mask that exposes a portion of the at least one of the first sacrificial fills and at least a portion of at least one of the second sacrificial fills.

3. The method of claim 2, wherein forming the dielectric cut in at least one of the second sacrificial fills comprises forming a second mask that exposes the at least one of the second sacrificial fills and at least a portion of at least one of the first sacrificial fills.

4. The method of claim 1, wherein forming the dielectric cut in at least one of the first sacrificial fills further comprises etching away exposed portions of the at least one of the first sacrificial fills using a selective etch to form a cut in the at least one of the first sacrificial fills.

5. The method of claim 1, wherein forming the dielectric cut further comprises forming a dielectric plug in the cut.

6. The method of claim 5, wherein the dielectric plug is formed from a material that is distinct from the final dielectric material.

7. The method of claim 1, wherein the final dielectric material is a low-k dielectric material.

8. The method of claim 7, wherein the final dielectric material includes air gaps.

9. The method of claim 1, wherein forming the lines of alternating first and second fills comprises etching trenches into the film, with spaces between the etched trenches.

10. A method of forming an integrated chip, comprising:
    forming lines of alternating first and second sacrificial fills in a film, separated from one another by portions of the film, from distinct, selectively etchable materials;
    forming a first cut in at least one of the first sacrificial fills;
    forming a second cut in at least one of the second sacrificial fills;
    forming respective dielectric plugs in each of the first and second cuts;
    replacing remaining first and second sacrificial fill material with a conductive material; and
    replacing the film with a low-k dielectric material that has air gaps.

11. The method of claim 10, wherein forming the dielectric cut in at least one of the first sacrificial fills comprises forming a first mask that exposes a portion of the at least one of the first sacrificial fills and at least a portion of at least one of the second sacrificial fills.

12. The method of claim 11, wherein forming the dielectric cut in at least one of the second sacrificial fills comprises forming a second mask that exposes the at least one of the second sacrificial fills and at least a portion of at least one of the first sacrificial fills.

13. The method of claim 10, wherein forming the dielectric cut in at least one of the first sacrificial fills further comprises etching away exposed portions of the at least one of the first sacrificial fills using a selective etch to form a cut in the at least one of the first sacrificial fills.

14. The method of claim 10, wherein the dielectric plug is formed from a material that is distinct from the final dielectric material.

\* \* \* \* \*